(12) United States Patent
Shi et al.

(10) Patent No.: US 11,853,125 B2
(45) Date of Patent: Dec. 26, 2023

(54) DISPLAY MODULE AND DISPLAY DEVICE

(71) Applicant: BOE TECHNOLOGY GROUP CO., LTD., Beijing (CN)

(72) Inventors: Boyang Shi, Beijing (CN); Yue Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 441 days.

(21) Appl. No.: 17/283,594

(22) PCT Filed: Jul. 31, 2020

(86) PCT No.: PCT/CN2020/106341
§ 371 (c)(1),
(2) Date: Apr. 8, 2021

(87) PCT Pub. No.: WO2022/021381
PCT Pub. Date: Feb. 3, 2022

(65) Prior Publication Data
US 2022/0302410 A1    Sep. 22, 2022

(51) Int. Cl.
*G06F 1/16* (2006.01)
*H10K 50/84* (2023.01)
*H10K 50/86* (2023.01)
*H10K 102/00* (2023.01)
*H10K 77/10* (2023.01)

(52) U.S. Cl.
CPC .......... *G06F 1/1652* (2013.01); *H10K 50/84* (2023.02); *H10K 50/86* (2023.02); *H10K 77/111* (2023.02); *H10K 2102/311* (2023.02)

(58) Field of Classification Search
CPC .......... G06F 1/1652; G06F 1/16; H10K 50/84
See application file for complete search history.

(56) References Cited

U.S. PATENT DOCUMENTS

| 2014/0065326 A1 | 3/2014 | Lee et al. |
| 2020/0006679 A1 | 1/2020 | Li |
| 2020/0044003 A1* | 2/2020 | Cho .......................... G09F 9/30 |

FOREIGN PATENT DOCUMENTS

| CN | 108877524 A | 11/2018 |
| CN | 110599903 A | 12/2019 |
| CN | 111292622 A | 6/2020 |
| CN | 111415586 A | 7/2020 |

* cited by examiner

*Primary Examiner* — Mukundbhai G Patel
(74) *Attorney, Agent, or Firm* — Lippes Mathias LLP

(57) ABSTRACT

A display module includes a display panel and a support structure. The display panel includes a display portion and a bending portion connected to the display portion. The display portion includes a first non-bending area, a bending area, and a second non-bending area that are sequentially arranged in a direction away from the bending portion. The support structure is disposed on a non-light-emitting side of the display portion and includes a first flexible part and a rigid part, an orthographic projection of the first flexible part on the display panel is within the first non-bending area, and an orthographic projection of the rigid part on the display panel is overlapped with the first non-bending area, the second non-bending area, and the bending area.

16 Claims, 10 Drawing Sheets

DISPLAY MODULE AND DISPLAY DEVICE

CROSS-REFERENCE TO RELATED APPLICATIONS

The present disclosure is a 371 of PCT Application No. PCT/CN2020/106341, filed on Jul. 31, 2020, which is incorporated herein by reference in its entirety.

TECHNICAL FIELD

The present disclosure relates to the field of display technologies, and in particular to a display module and a display device.

BACKGROUND

With the development of science and technology, flexible display panels are widely applied to foldable display devices due to their good bending performance

SUMMARY

In an aspect, a display module is provided. The display module includes:

a display panel, including a display portion and a bending portion connected to the display portion, wherein the display portion comprises a first non-bending area, a bending area, and a second non-bending area that are sequentially arranged in a direction away from the bending portion; and a support structure, disposed on a non-light-emitting side of the display portion, and including a first flexible part and a rigid part, wherein an orthographic projection of the first flexible part on the display panel is within the first non-bending area, and an orthographic projection of the rigid part on the display panel is overlapped with the first non-bending area, the second non-bending area, and the bending area, wherein one end of the bending portion is connected to the display portion, and an other end of the bending portion is bent to a side, away from the display portion, of the support structure.

In another aspect, a display device is provided. The display device includes: a drive circuit and the display module in the above aspect, wherein the drive circuit is disposed on a side, away from a support structure, of a bending portion of a display panel, and the drive circuit is configured to provide a drive signal to a display portion of the display panel.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the present disclosure clearer, implementations of the present disclosure are described hereinafter in detail with reference to the accompanying drawings.

An organic light-emitting diode (OLED) display panel has various advantages such as self-illumination, low driving voltage, short response time, high definition, and high contrast and thus is widely applied to display devices. In addition, the OLED display panel can be used in a foldable display device due to its good bending performance.

Figure 1:
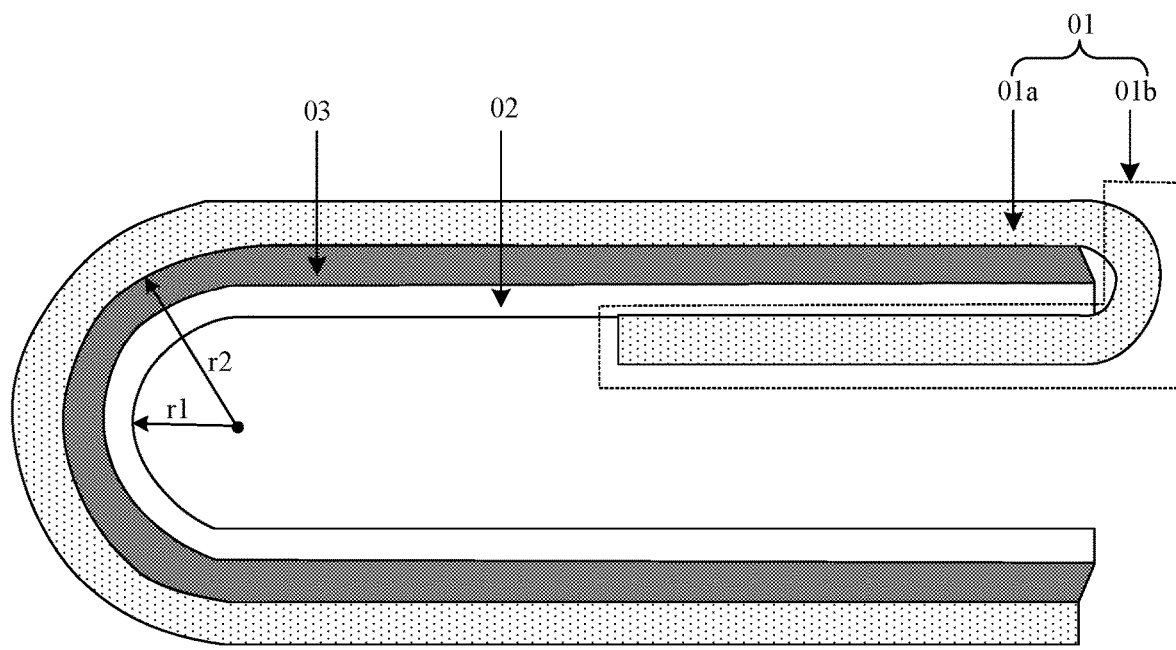
FIG. 1 is a schematic structural diagram of a display device in the related art.

Referring to FIG. 1, the foldable display device may include: a display panel 01, a support structure 02 disposed on a side of the display panel 01, and an adhesive layer 03 disposed between the display panel 01 and the support structure 02. The adhesive layer 03 may be configured to bond the display panel 01 with the support structure 02. The display panel 01 has a display area 01a and a bending area 01b disposed on a side of the display area 01a. To ensure the screen-to-body ratio of the foldable display device, the bending area 01b of the display panel 01 may wrap the support structure 02 and may be bent to a side, away from the display area 01a, of the support structure 02.

Referring to FIG. 1, after the foldable display device is folded outward, the display panel 01 is located on an outer side relative to the support structure 02. That is, a display surface of the display panel 01 is located on the outer side. In addition, after the foldable display device is folded outward, the bending radius r1 of the support structure 02 is different from the bending radius r2 of the display panel 01, for example, r1<r2. Therefore, a misalignment occurs between the end, wrapped by the display panel 01, of the support structure 02 and the display panel 01. The end, wrapped by the display panel 01, of the support structure 02 may prick the bending area 01*b* of the display panel 01, to affect the yield of the display panel 01.

In the related art, the size of the support structure in a foldable display device may be designed to be relatively small, so that after the foldable display device is folded, the top portion of the end, surrounded by the display panel, of the support structure is prevented from reaching the bending area of the display panel, thereby reducing the risk of pricking the display panel.

However, if the size of the support structure is designed to be relatively small, when the foldable display device is in a flat state, the end, surrounded by the display panel, of the support structure has no support, which leads to bulges on the bending area of the display panel, thereby affecting the assembly of the display panel and other components. In addition, due to the influence of manufacturing tolerance in the support structure, even if the size of the support structure is designed to be relatively small, there is still a risk of pricking the display panel.

Figure 2:
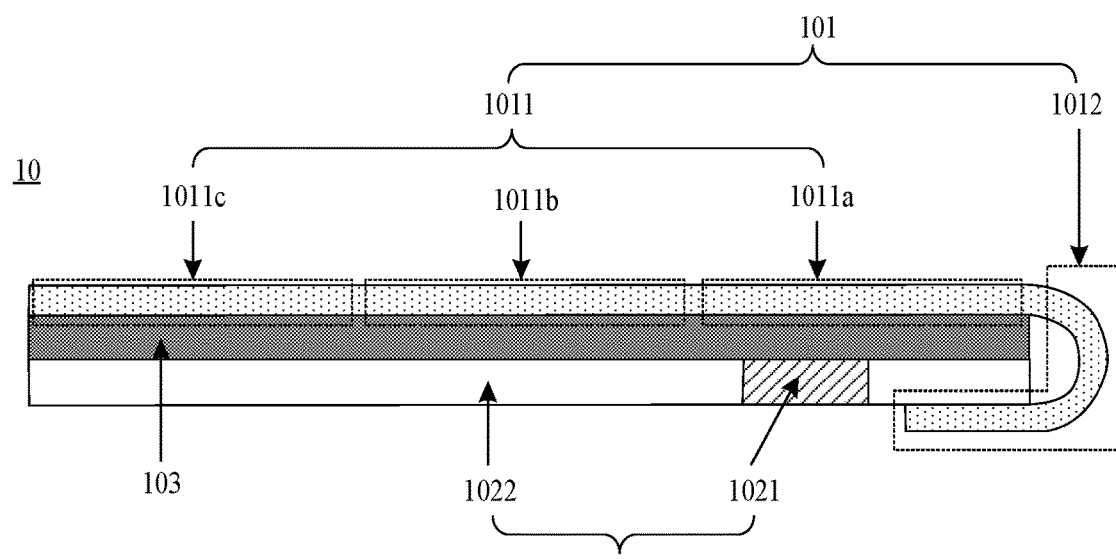
FIG. 2 is a schematic structural diagram of a display module according to an embodiment of the present disclosure.
Figure 3:
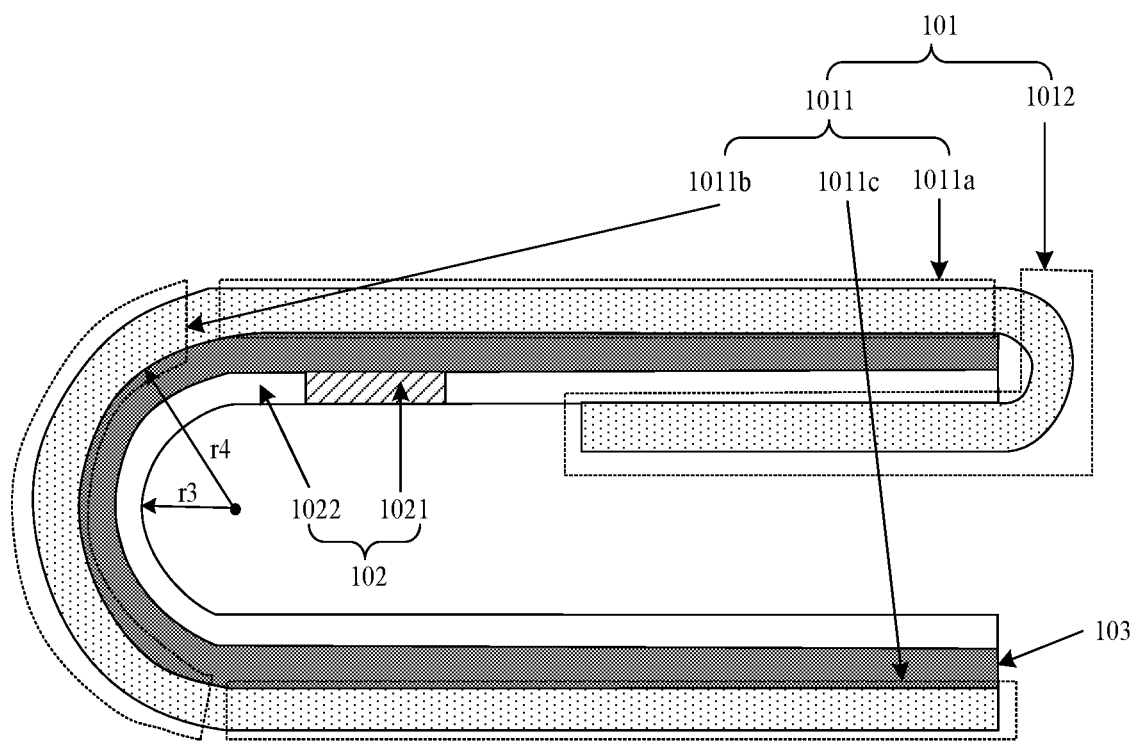
FIG. 3 is a schematic diagram of the display module shown in FIG. 2 being folded outward.

An embodiment of the present disclosure provides a display module, which is capable of solving the problem that the yield of a display panel is relatively low in the related art. Referring to FIG. 2 and FIG. 3, the display module 10 may include a display panel 101 and a support structure 102. The display panel 101 may include a display portion 1011 and a bending portion 1012 connected to the display portion 1011. The display portion 1011 has a first non-bending area 1011*a*, a bending area 1011*b*, and a second non-bending area 1011*c* that are sequentially arranged in a direction away from the bending portion 1012. The support structure 102 may be located on a non-light-emitting side of the display portion 1011. The support structure 102 may include a first flexible part 1021 and a rigid part 1022. The orthographic projection of the first flexible part 1021 on the display panel 101 may be within the first non-bending area 1011*a*. The orthographic projection of the rigid part 1022 on the display panel 101 may be overlapped with the first non-bending area 1011*a*, the second non-bending area 1011*c*, and the bending area 1011*b*. Referring to FIG. 3, the display module 10 may be U-shaped after being folded outward.

One end of the bending portion 1012 may be connected to the display portion 1011, and the other end thereof may be bent to the side, away from the display portion 1011, of the support structure 102. That is, the bending portion 1012 may wrap the end, close to the bending portion 1012, of the support structure 102. By bending the bending portion 1012 of the display panel 101 to the side, away from the display portion 1011, of the support structure 102, occupation of a large space by the boundary of the display panel 101 can be avoided, thereby improving the screen-to-body ratio of the display device.

Referring to FIG. 3, the first flexible part 1021, in the first non-bending area 1011*a*, of the support structure 102 has good flexibility. Therefore, when the display device is folded outward, the first flexible part 1021 of the support structure 102 can provide buffer for the misalignment between the support structure 102 and the display panel 101. That is, even if the bending radius r3 of the support structure 102 is different from the bending radius r4 of the display panel 101 when the display device is folded outward, a relatively large misalignment does not occur between the end, close to the bending portion 1012 of the display panel, of the support structure 102 and the display panel 101, so that the risk that the support structure 102 pricks the display panel 101 is reduced. Thus, the yield of the display panel 101 is ensured, and the display device has a good display effect.

In addition, as the rigid part 1022, in the bending area 1011*b*, of the support structure 102 has good rigidity, when the display device is folded outward, the rigid part 1022 in the bending area 1011*b* has a certain opposite resilience force. When the display device needs to return to a flat state from a folded state, the rigid part 1022 can return to the flat state under the action of the opposite resilience force, so that the flatness of the display device after returning to the flat state from the folded state can be ensured. Thus, the display effect of the display device in the flat state can be ensured.

In summary, the embodiment of the present disclosure provides a display module. The display module includes a display panel and a support structure. The first flexible part of the support structure has good flexibility. When a display device is folded, the first flexible part of the support structure can provide buffer for the misalignment between the support structure and the display panel, thereby reducing the risk that the support structure pricks the display panel. Therefore, the yield of the display panel is relatively high, and the display device has a good display effect. In addition, because the rigid part in the bending area in the support structure has good rigidity, the flatness of the display device after the display device returns to a flat state from a folded state can be ensured, and the display effect of the display device in the flat state can be ensured.

Optionally, the display panel 101 may be an OLED display panel. The OLED display panel is a flexible display panel and has good bending performance.

It should be noted that the display device may also be folded inward, and after the display device is folded inward, the display panel 101 is disposed at an inner side relative to the support structure 102. That is, the display surface of the display panel 01 is disposed at the inner side. The display device is more portable being folded inward than being folded outward. In addition, because the display panel 101 is disposed at the inner side, the display panel 101 can be prevented from being extruded or scraped. Certainly, to make it convenient for users to view related information displayed on the display panel when the display device is folded inward, the display device further includes a secondary screen manufactured by using a glass cover plate. However, the thickness of the display device increases due to the presence of the secondary screen.

Accordingly, to prevent a display device from being excessively thick, the display device in the related art is folded in a water drop-shaped manner instead of a wedge-shaped manner. After the display device is folded in manners other than the water drop-shaped manner, there are water drop-shaped gaps in the bending area, and the distance between the two non-bending areas is small. After the display device is folded in the wedge-shaped manner, the distance between the two non-bending areas gradually decreases in a direction away from the bending area. That is, the thickness of the display device is relatively large near the bending area, and the thickness gradually decreases in the direction away from the bending area.

Figure 4:
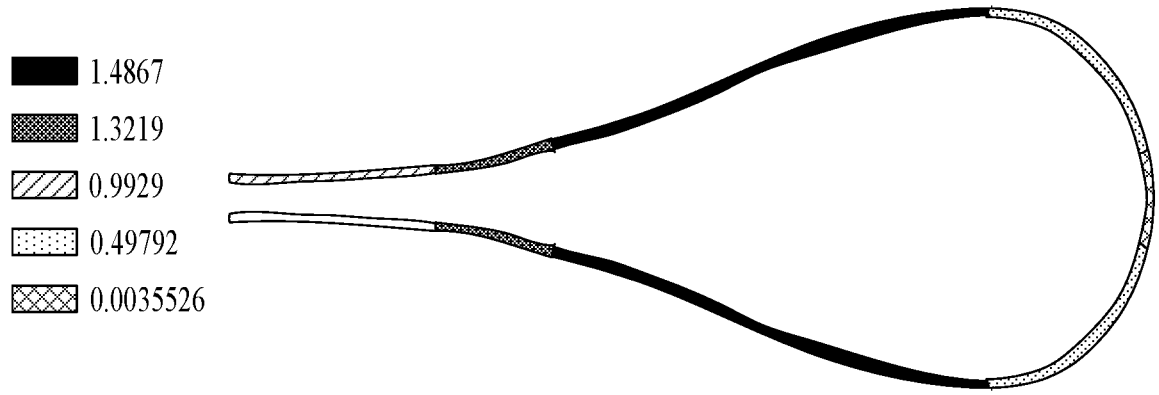
FIG. 4 is a schematic diagram of a strain result of an adhesive layer in a display device in the related art.

Referring to FIG. 4, as can be seen from the result of a strain test of film layers in the display module, when the display device is folded in a water drop-shaped manner, the strain in the part, close to the bending area, of the non-bending area in the display module is relatively large (the strain is 1.4867), such that the film layers in the part, close to the bending area, of the non-bending area in the display module are prone to a failure. For example, referring to FIG.

4, the strain at the side, close to the non-bending area, of the bending area is 0.49792, the strain at the side, away from the non-bending area, of the bending area is 0.0035526, and strains in the non-bending area in the direction away from the bending area are sequentially 1.4867, 1.3219, and 0.9929.

Figure 5:
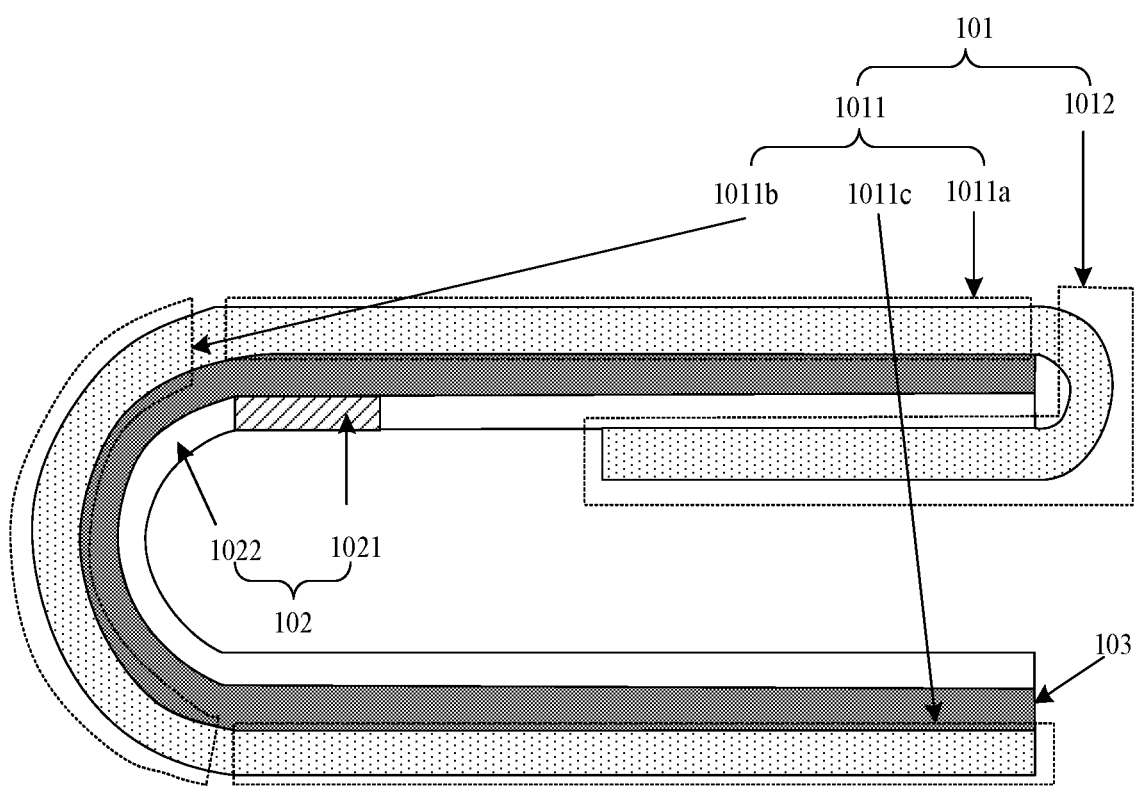
FIG. 5 is a schematic structural diagram of another display module according to an embodiment of the present disclosure.

As can be known from FIG. 4, the strain in the part, close to the bending area, of the non-bending area in the display module 10 is the largest, which may cause failure of the film layers in the part, close to the bending area, of the non-bending area in the display module 10. Therefore, in the embodiments of the present disclosure, referring to FIG. 5, the orthographic projection of the first flexible part 1021 on the display panel 101 may be on the side, close to the bending area 1011b, of the first non-bending area 1011a. The first flexible part 1021 can provide buffer for the side, close to the bending area 1011b, of the first non-bending area 1011a, such that the strain at the side, close to the bending area 1011b, of the first non-bending area 1011a may decrease when the display device is folded inward, thereby reducing the risk that the film layers in the part, close to the bending area 1011b, of the display module 10 fail.

Figure 6:
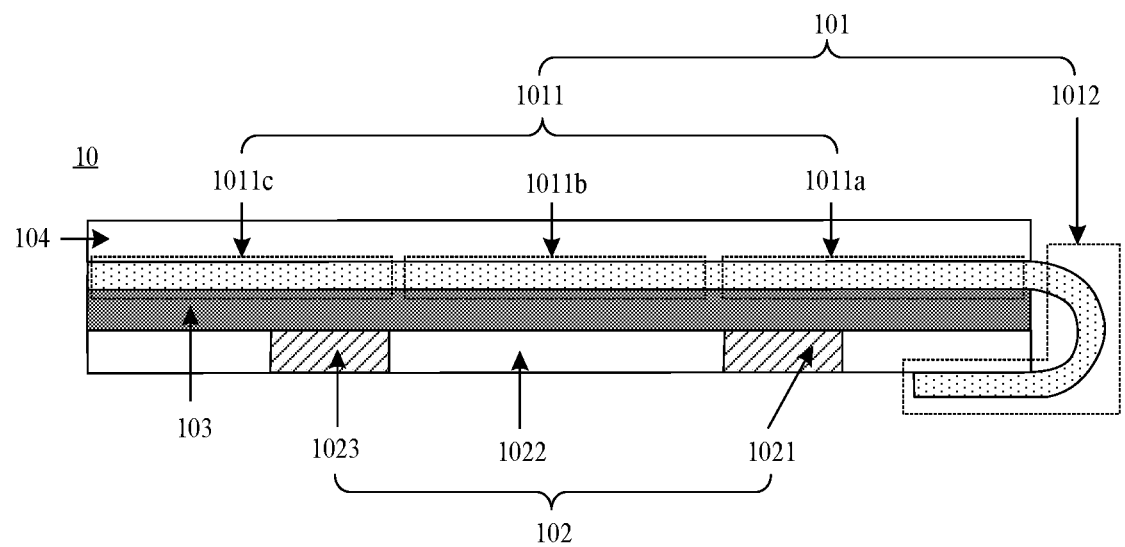
FIG. 6 is a schematic structural diagram of still another display module according to an embodiment of the present disclosure.
Figure 7:
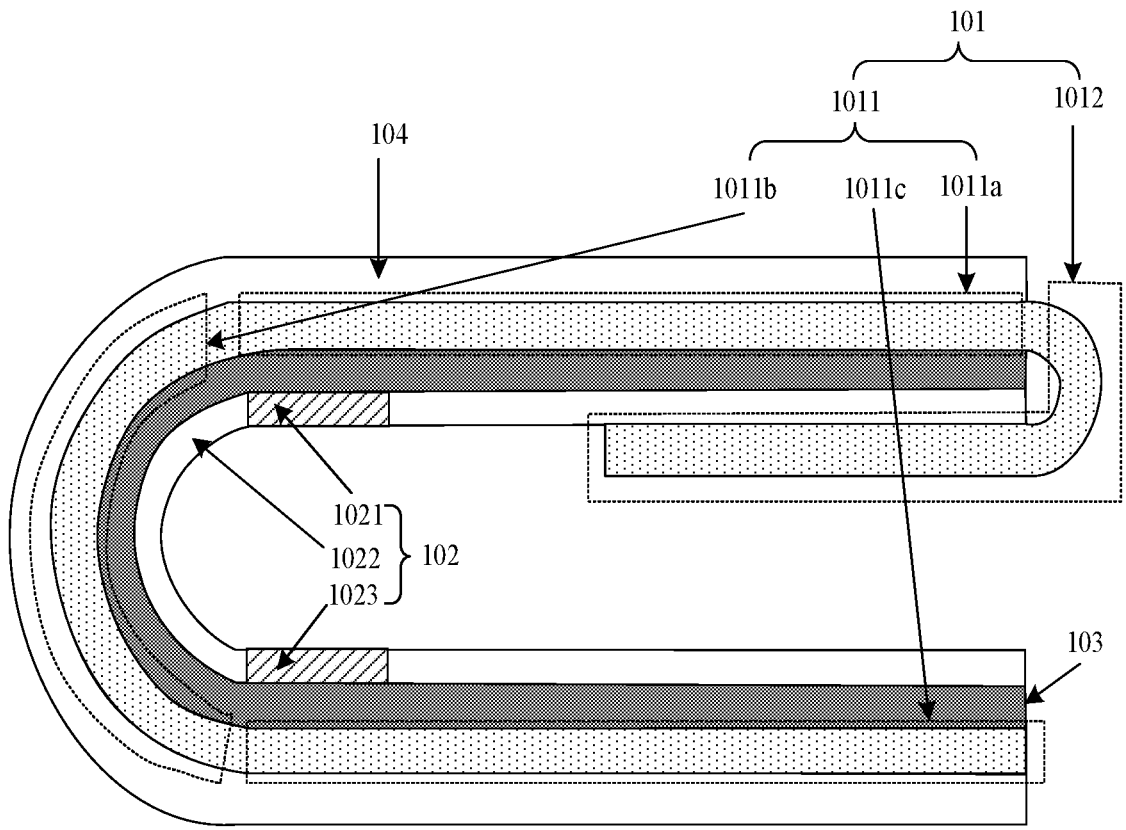
FIG. 7 is a schematic diagram of the display module shown in FIG. 6 being folded outward.

FIG. 6 is a schematic structural diagram of still another display module according to an embodiment of the present disclosure. FIG. 7 is a schematic diagram of the display module shown in FIG. 6 being folded outward. Referring to FIG. 6 and FIG. 7, the support structure 102 may further include a second flexible part 1023. An orthographic projection of the second flexible part 1023 on the display panel 101 may be within the second non-bending area 1011c. By disposing two flexible parts (the first flexible part 1021 and the second flexible part 1023) in the support structure 102, the two flexible part can both provide buffer for the misalignment between the support structure 102 and the display panel 101, and the buffer is better than that in the circumstance in which only one flexible part is disposed, so that the risk that the support structure 102 pricks the display panel 101 can be further reduced, and the yield of the display panel 101 is ensured.

Figure 8:
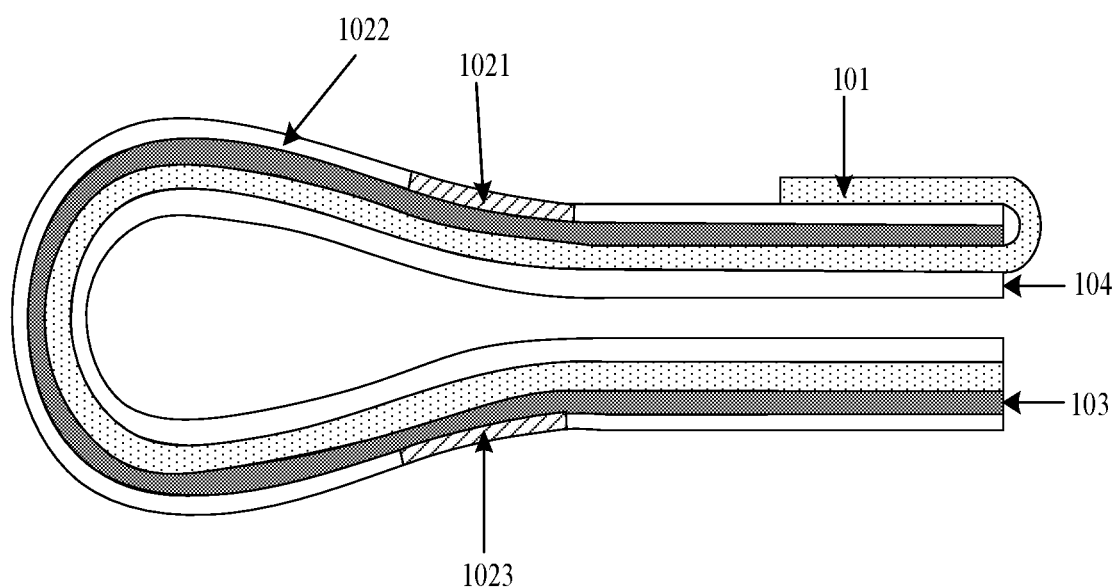
FIG. 8 is a schematic diagram of the display module shown in FIG. 6 being folded inward.

Referring to FIG. 6, the orthographic projection of the second flexible part 1023 on the display panel may be on the side, close to the bending area 1011b, of the second non-bending area 1011c. FIG. 8 is schematic diagram of the display module shown in FIG. 6 being folded inward. Referring to FIG. 6 and FIG. 8, the second flexible part 1023 can provide buffer for the side, close to the bending area 1011b, of the second non-bending area 1011c, such that the strain at the side, close to the bending area 1011b, of the second non-bending area 1011c may decrease when the display device is folded inward, thereby reducing the risk that the film layers in the part, close to the bending area 1011b, of the display module 10 fail.

In the embodiments of the present disclosure, the material of the first flexible part 1021 may be the same as the material of the second flexible part 1023, and both of the materials may include at least one of rubber and polyurethane foam. The material of the rigid part 1022 may include a metal material. Rubber has an elastic modulus of 10 megapascal (MPa) and a Poisson's ratio of 0.47.

Figure 9:
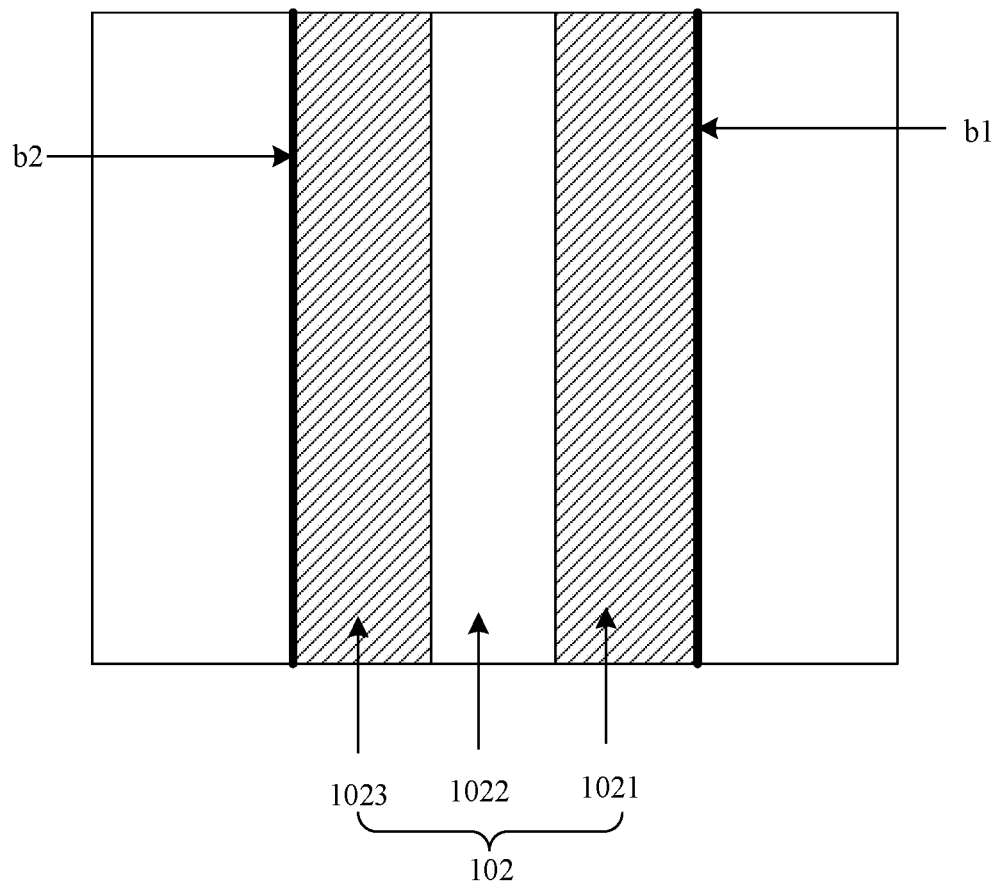
FIG. 9 is a top view of a support structure according to an embodiment of the present disclosure.

FIG. 9 is a top view of a support structure according to an embodiment of the present disclosure. As can be seen from FIG. 9, the first flexible part 1021 and the second flexible part 1023 may both be strip-shaped structures. The extending direction of the first flexible part 1021 may be parallel to a first boundary b1 between the first non-bending area 1011a and the bending area 1011b, and the length of the first flexible part 1021 may be equal to the length of the first boundary b1. The extending direction of the second flexible part 1023 may be parallel to a second boundary b2 between the second non-bending area 1011c and the bending area 1011b, and the length of the second flexible part 1023 may be equal to the length of the second boundary b2.

Referring to FIG. 9, a border, away from the second flexible part 1023, of the first flexible part 1021 may be collinear with the first boundary b1. A border, away from the first flexible part 1021, of the second flexible part 1023 may be collinear with the second boundary b2.

The first boundary b1 may be parallel to the second boundary b2, and the length of the first boundary b1 may be equal to the length of the second boundary b2. Correspondingly, the extending direction of the first flexible part 1021 may be parallel to the extending direction of the second flexible part 1023, and the length of the first flexible part 1021 may be equal to the length of the second flexible part 1023.

Optionally, the length of the first flexible part 1021 and the length of the second flexible part 1023 may both be equal to the length of a side, which is not folded, of the display panel 101. The orthographic projection of the first flexible part 1021 on the display panel 101 may penetrate the first non-bending area 1011a of the display panel 101, and the orthographic projection of the second flexible part 1023 on the display panel 101 may penetrate the second non-bending area 1011c of the display panel 101.

In this embodiment of the present disclosure, the first flexible part 1021, the rigid part 1022, and the second flexible part 1023 may be three independent parts. Therefore, to prevent the first flexible part 1021, the rigid part 1022, and the second flexible part 1023 from loosening in the process of folding the display device, a sidewall of the first flexible part 1021 and a sidewall of the second flexible part 1023 may be bonded to sidewalls of the rigid part 1022 respectively with an adhesive.

Referring to FIG. 2, FIG. 3, and FIG. 5 to FIG. 8, the display module 10 may further include a first adhesive layer 103. The first adhesive layer 103 may be disposed between the display portion 1011 and the support structure 102. The first adhesive layer 103 may be configured to bond the display portion 1011 of the display panel 101 with the support structure 102, to avoid a relative movement between the display portion 1011 and the support structure 102, so that the display device has good reliability.

Figure 10:
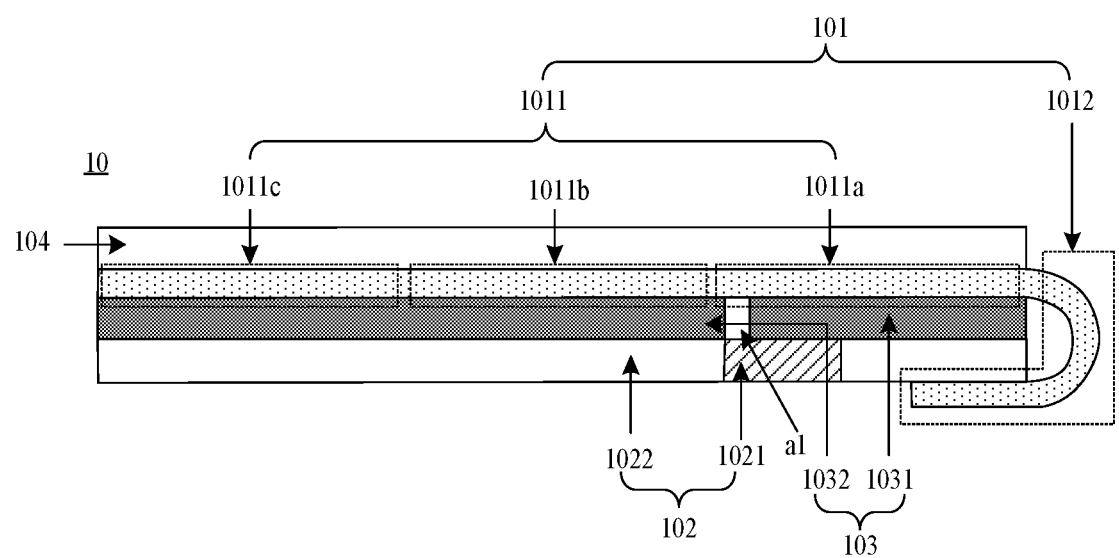
FIG. 10 is a schematic structural diagram of yet another display module according to an embodiment of the present disclosure.

FIG. 10 is a schematic structural diagram of yet another display module according to an embodiment of the present disclosure. Referring to FIG. 10, the first adhesive layer 103 may include a first adhesive 1031 and a second adhesive 1032 that are sequentially arranged in the direction away from the bending portion 1012. A first gap a1 may be provided between the first adhesive 1031 and the second adhesive 1032. An orthographic projection of the first gap a1 on the display panel 101 is overlapped with the orthographic projection of the first flexible part 1021 on the display panel 101.

The first gap a1 between the first adhesive 1031 and the second adhesive 1032 included in the first adhesive layer 103 is in the first flexible part 1021. Therefore, the orthographic projection of the first adhesive 1031 on the display panel 101 may be overlapped with the first non-bending area 1011a, and the orthographic projection of the second adhesive 1032 on the display panel 101 may be overlapped with the bending area 1011b and the second non-bending area 1011c. If the orthographic projection of the first flexible part 1021 on the display panel 101 is in other areas, instead of the side, close to the bending area 1011b, of the first non-bending area 1011a, the orthographic projection of the second adhesive 1032 on the display panel 101 may be further overlapped with the first non-bending area 1011a.

When the display device is folded outward, the part, in the bending area 1011b, of the second adhesive 1032 deforms due to bending. The first gap a1 is provided between the first adhesive 1031 and the second adhesive 1032. Therefore, the first adhesive 1031 is not affected by the deformation of the second adhesive 1032, such that the amount of misalignment between an end, close to the bending portion 1012 of the display panel, of the first adhesive 1031 and the display panel 101 can decrease. Thus, the amount of misalignment between the support structure 102 on the side of the first adhesive 1031 and the display panel 101 decrease, thereby effectively reducing the risk that the support structure 102 pricks the display panel 101.

Figure 11:
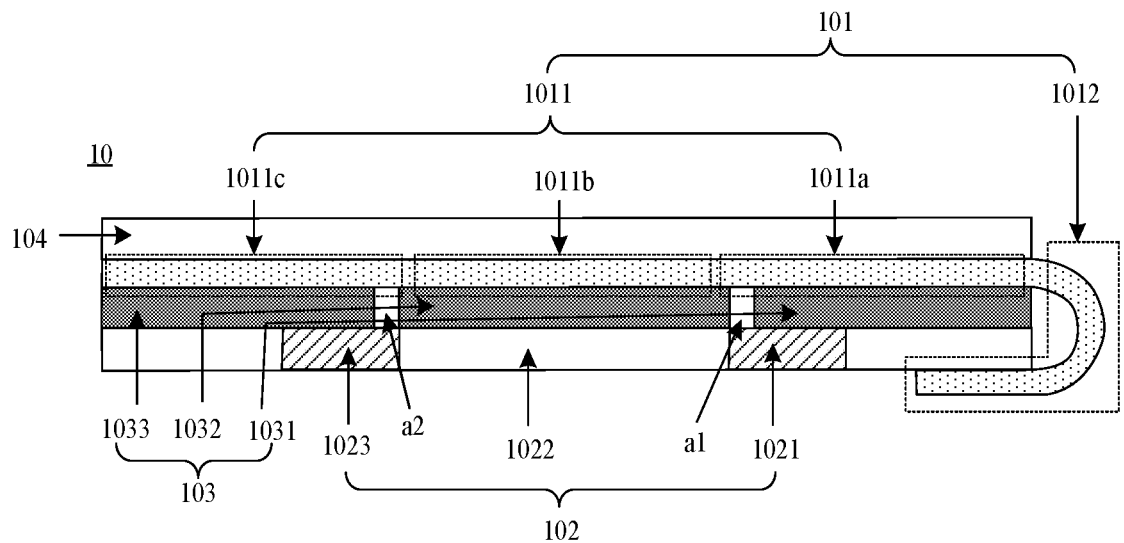
FIG. 11 is a schematic structural diagram of yet another display module according to an embodiment of the present disclosure.

FIG. 11 is a schematic structural diagram of yet another display module according to an embodiment of the present disclosure. As can be seen from FIG. 11, in the case that the support structure 102 further includes the second flexible part 1023, the first adhesive layer 103 may further include a third adhesive 1033 disposed on the side, away from the first adhesive 1031, of the second adhesive 1032. A second gap a2 may be provided between the second adhesive 1032 and the third adhesive 1033. The orthographic projection of the second gap a2 on the display panel 101 may be overlapped with the orthographic projection of the second flexible part 1023 on the display panel 101.

When the display device is folded outward, the part, in the bending area 1011b, of the second adhesive 1032 deforms due to bending. The second gap a2 is provided between the third adhesive 1033 and the second adhesive 1032. Therefore, the third adhesive 1033 is not affected by the deformation of the second adhesive 1032, such that the amount of misalignment between the end, away from the bending portion 1012 of the display panel 101, of the third adhesive 1033 and the display panel 101 is relatively small. The end, away from the bending portion 1012, of the first adhesive layer 103 and an end portion of the end, away from the bending portion 1012, of the display portion 1011 of the display panel 101 may be in the same plane and have adequate flatness. Thus, the display device has a good display effect.

Figure 12:
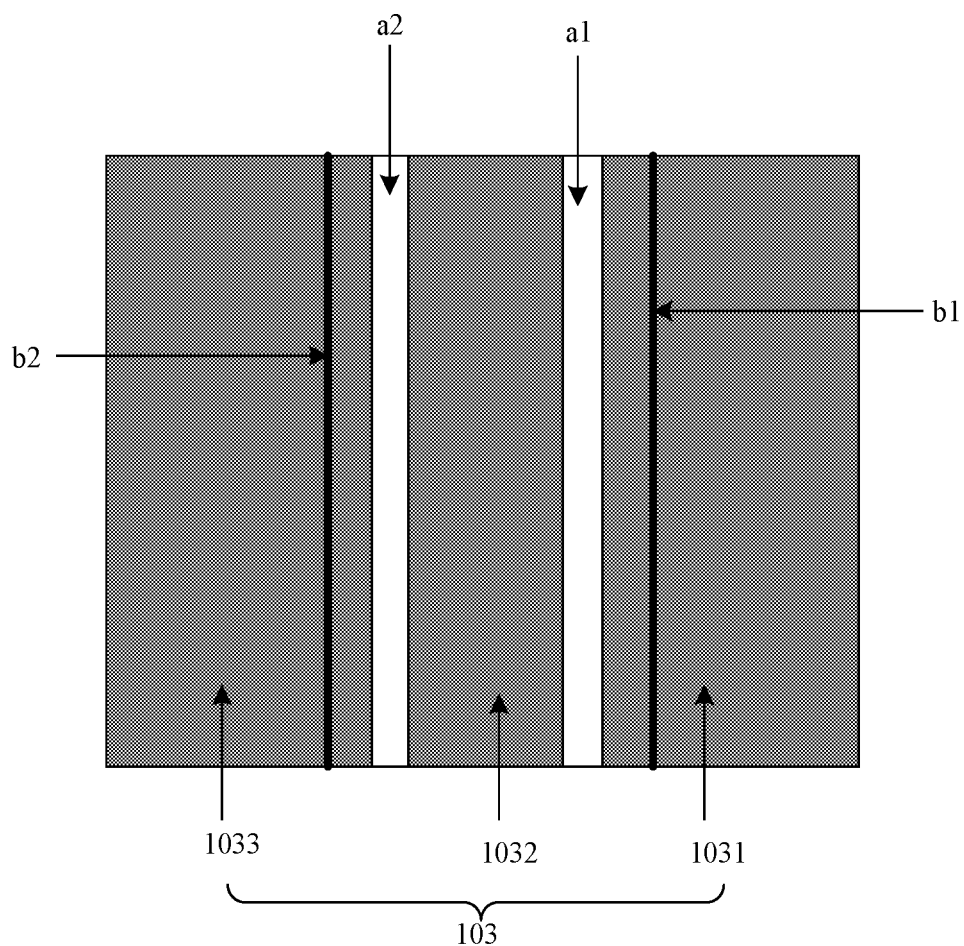
FIG. 12 is a top view of a first adhesive layer according to an embodiment of the present disclosure.

FIG. 12 is a top view of a first adhesive layer according to an embodiment of the present disclosure. As can be seen from FIG. 12, the first gap a1 and the second gap a2 may both be strip-shaped gaps. The extending direction of the first gap a1 may be parallel to the first boundary b1, and the length of the first gap a1 may be equal to the length of the first boundary b1. The extending direction of the second gap a2 may be parallel to the second boundary b2, and the length of the second gap a2 may be equal to the length of the second boundary b2. Here, the length of the first boundary b1 is equal to the length of the second boundary b2, and correspondingly the length of the first gap a1 is equal to the length of the second gap a2.

Figure 13:
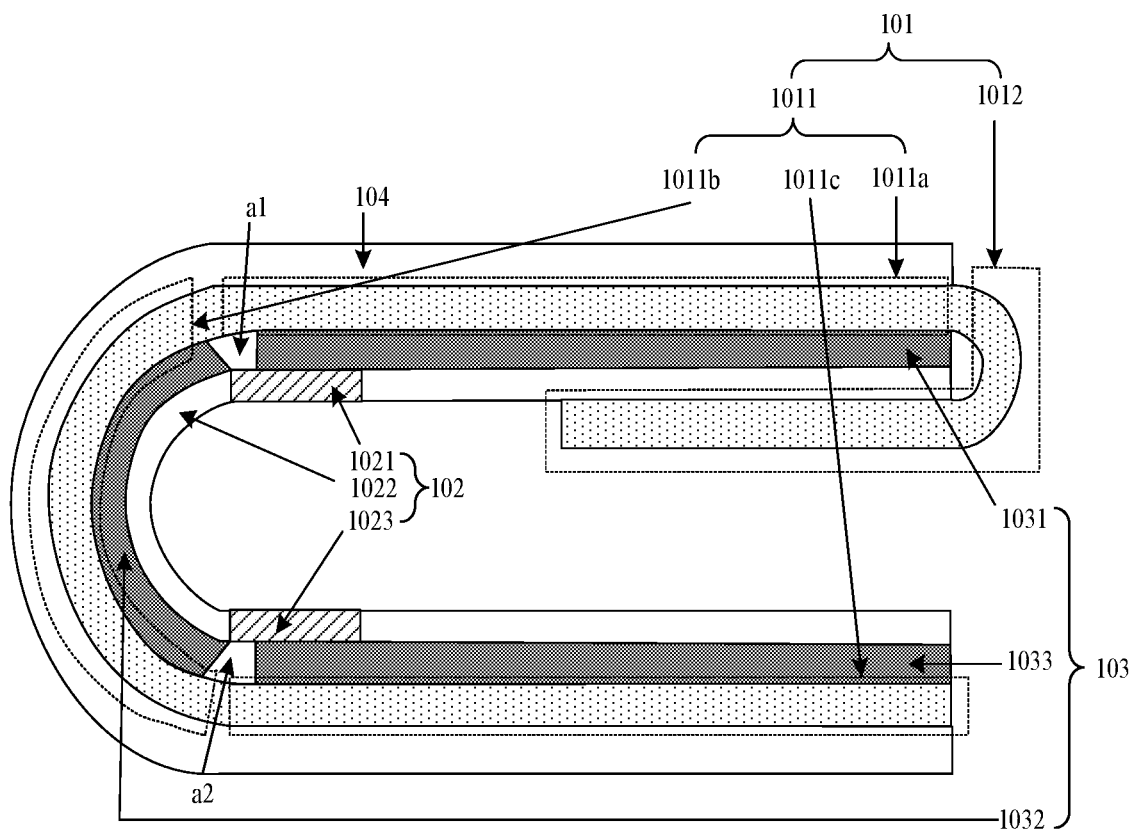
FIG. 13 is a schematic diagram of the display module shown in FIG. 11 being folded outward.

FIG. 13 is a schematic diagram of the display module shown in FIG. 11 being folded outward. Referring to FIG. 13, the support structure 102 in the display module 10 includes the first flexible part 1021, the rigid part 1022, and the second flexible part 1023. The first flexible part 1021 and the second flexible part 1023 may both provide buffer for the misalignment between the support structure 102 and the display panel 101, such that the risk that the support structure 102 pricks the display panel 101 is relatively low, and the yield of the display panel 101 is relatively high.

In addition, the first gap a1 is provided between the first adhesive 1031 and the second adhesive 1032 included in the first adhesive layer 103, and the second gap a2 is provided between the second adhesive 1032 and the third adhesive 1033. Therefore, the influence of the deformation of the second adhesive 1032 on the first adhesive 1031 and the third adhesive 1033 when the display device is folded outward can be decreased. The amount of misalignment between the first adhesive 1031 and the display panel 101 the amount of misalignment between the third adhesive 1033 and the display panel 101 can be decreased, so that the amount of misalignment between the support structure 102 on the side of the first adhesive layer 103 and the display panel 101 is decreased, thereby effectively reducing the risk that the support structure 102 pricks the display panel 101.

Figure 14:
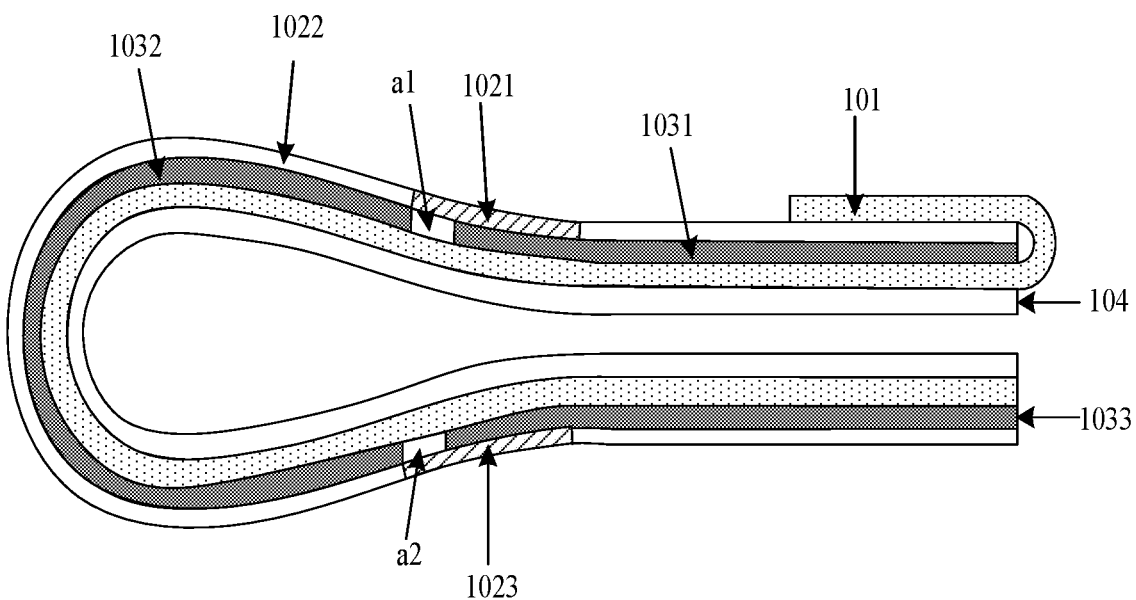
FIG. 14 is a schematic diagram of the display module shown in FIG. 11 being folded inward.

FIG. 14 is a schematic diagram of the display module shown in FIG. 11 being folded inward. Referring to FIG. 14, the orthographic projection of the first flexible part 1021 included in the support structure 102 of the display module 10 on the display panel 101 is on the side, close to the bending area 1011b, of the first non-bending area 1011a, and the orthographic projection of the second flexible part 1023 on the display panel 101 is on the side, close to the bending area 1011b, of the second non-bending area 1011c. Therefore, the first flexible part 1021 may provide buffer for the side, close to the bending area 1011b, of the first non-bending area 1011a, so that the strain in the side, close to the bending area 1011b, of the first non-bending area 1011a when the display device is folded inward can decrease. In addition, the second flexible part 1023 may provide buffer for the side, close to the bending area 1011b, of the second non-bending area 1011c, so that the strain in the side, close to the bending area 1011b, of the second non-bending area 1011c can decrease. Thus, the risk that the film layers in the part, close to the bending area 1011b, of the display module 10 fail can be reduced. For example, the risk that the first adhesive layer 103 fails can be reduced.

Figure 15:
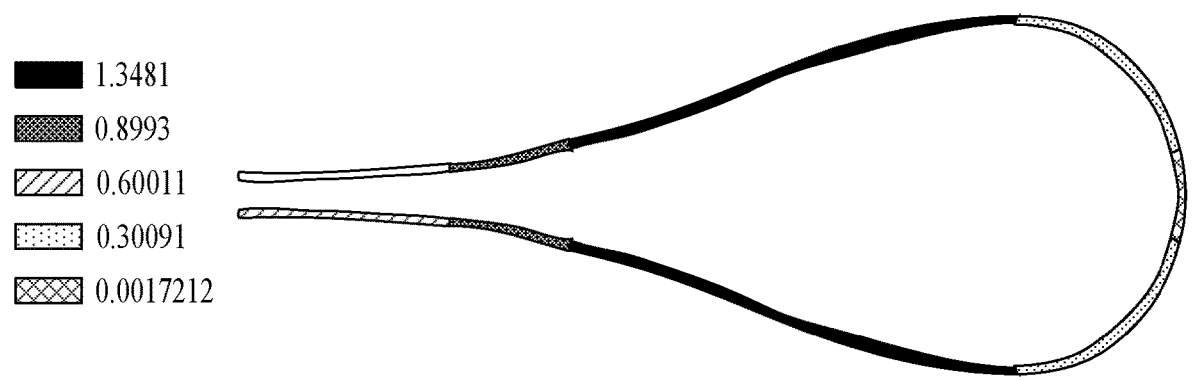
FIG. 15 is a schematic diagram of a strain result of a first adhesive layer in a display module according to an embodiment of the present disclosure.

Referring to FIG. 15, as can be seen from the result of a strain test of the first adhesive layer 103, the strain in the side, close to the non-bending area, of the bending area is 0.30091, the strain in the side, away from the non-bending area, of the bending area is 0.0017212, and the strains in the non-bending area are sequentially 1.3481, 0.8993, and 0.60011 in the direction away from the bending area. As can be seen from both FIG. 4 and FIG. 15, strains in areas in the display module 10 provided in this embodiment of the present disclosure decrease, and the display module 10 has good reliability.

In addition, the first gap a1 is provided between the first adhesive 1031 and the second adhesive 1032 included in the first adhesive layer 103, and the second gap a2 is provided between the second adhesive 1032 and the third adhesive 1033. Therefore, the influence of the deformation of the second adhesive 1032 on the first adhesive 1031 and the third adhesive 1033 when the display device is folded inward can be avoided, thereby ensuring the display effect of the display device.

In this embodiment of the present disclosure, the display module 10 shown in FIG. 11 may be folded outward or may be folded inward. When the display module 10 is folded outward, the support structure 102 does not prick the display panel 101, and thus the yield of the display panel is relatively high. When the display module 10 is folded inward, the risk that the film layers in the part, close to the bending area 1011b, of the display module 10 fail is relatively low, and thus the display device has an adequate display effect.

Referring to FIG. 6 to FIG. 8, FIG. 10, FIG. 11, FIG. 13, and FIG. 14, the display module 10 may further include: a flexible cover plate 104 disposed on a light-emitting side of the display portion 1011. The flexible cover plate 104 may be configured to protect the light-emitting side of the display portion 1011 of the display panel 101, to prevent the light-emitting side of the display portion 1011 from being scraped, thereby ensuring the yield of the display panel 101.

Figure 16:
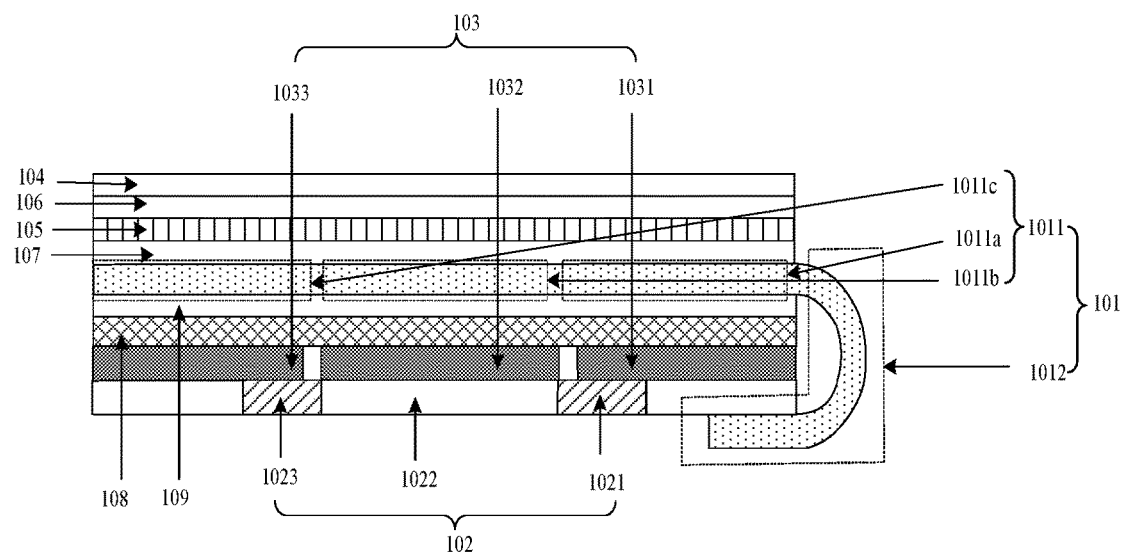
FIG. 16 is a schematic structural diagram of yet another display module according to an embodiment of the present disclosure.

FIG. 16 is a schematic structural diagram of yet another display module according to an embodiment of the present disclosure. As can be seen from FIG. 16, the display module may further include a polarizing layer 105. The polarizing layer 105 may be disposed between the display portion 1011 and the flexible cover plate 104.

Generally, the OLED display panel includes at least one film layer (for example, a cathode layer) manufactured from a metal material, and the film layer manufactured from the metal material reflects ambient light irradiating into the OLED display panel. In addition, the more intense the external ambient light is, the more intense the light reflected by the OLED display panel is. As a result, in the case that external ambient light is relatively intense, users may fail to clearly see the content displayed on the OLED display panel.

Therefore, in this embodiment of the present disclosure, by disposing the polarizing layer 105 in the display module 10, light reflected by film layers in the display panel 101 can be prevented from being emitted outside. Therefore, the contrast of the display device is improved, and user experience is improved.

Optionally, the polarizing layer 105 may include a circular polaroid. When external ambient light irradiates into the display module 10 and passes through the circular polaroid to turn into circularly polarized light. The circularly polarized light is reflected after irradiating into the film layer manufactured from the metal material in the display panel 101. The direction of rotation of the reflected circularly polarized light changes, and the reflected circularly polarized light cannot pass through the circular polaroid. That is, light reflected by the film layers in the display panel 10 is prevented from being emitted outside.

As can further be seen from FIG. 16, the display module may further include a second adhesive layer 106 and a third adhesive layer 107. The second adhesive layer 106 may be disposed between the polarizing layer 105 and the flexible cover plate 104, and the third adhesive layer 107 may be disposed between the polarizing layer 105 and the display portion 1011. The second adhesive layer 106 may be configured to bond the polarizing layer 105 with the flexible cover plate 104, and the third adhesive layer 107 may be configured to bond the polarizing layer 105 with the display portion 1011 of the display panel 101. By disposing the second adhesive layer 106 and the third adhesive layer 107, the relative movement between film layers in the display module 10 can be avoided, and thus the display device has good reliability.

Referring to FIG. 16, the display module 10 may further include a back film 108. The back film 108 may be disposed between the support structure 102 and the display portion 1011. The back film 108 may be configured to protect the non-light-emitting side of the display portion 1011, to prevent the non-light-emitting side of the display portion 1011 from being scraped, thereby ensuring the yield of the display panel 101.

Optionally, referring to FIG. 16, the display module 10 further includes a fourth adhesive layer 109. The fourth adhesive layer 109 may be disposed between the back film 108 and the display portion 1011. The fourth adhesive layer 109 may be configured to bond the back film 108 with the display portion 1011, to avoid the relative movement between the back film 108 and the display portion 1011, thereby ensuring the flatness of the back film 108. Thus, the display device has good reliability.

In the embodiments of the present disclosure, a support structure (for example, including only a rigid part) in the prior art is used to replace the support structure in FIG. 16, and strains in the first adhesive layer 103, the second adhesive layer 106, the third adhesive layer 107, and the fourth adhesive layer 109 are tested. Referring to Table 1, if the support structure is the support structure in the prior art, the strain in the first adhesive layer is 1.487, the strain in the second adhesive layer is 0.962, the strain in the third adhesive layer is 1.524, and the strain in the fourth adhesive layer is 1.978.

In addition, the strains in the first adhesive layer 103, the second adhesive layer 106, the third adhesive layer 107, and the fourth adhesive layer 109 in the display module 10 (the support structure 102 includes, for example, the first flexible part 1021, the rigid part 1022, and the second flexible part 1023) shown in FIG. 16 are tested. Referring to Table 1, the strain in the first adhesive layer is 1.348, the strain in the second adhesive layer is 0.339, the strain in the third adhesive layer is 1.308, and the strain in the first adhesive layer is 1.425.

TABLE 1

| Film layer | The support structure includes only a rigid part | The support structure includes a first flexible part, a rigid part, and a second flexible part |
| --- | --- | --- |
| First adhesive layer | 1.487 | 1.348 |
| Second adhesive layer | 0.962 | 0.339 |
| Third adhesive layer | 1.524 | 1.308 |
| Fourth adhesive layer | 1.978 | 1.425 |

As can be seen from the foregoing Table 1, the support structure 102 provided in the embodiments of the present disclosure is used in the display module 10, so that strains in the adhesive layers in the display module 10 can be reduced, thereby reducing the risk that the adhesive layers fail. Thus, the display module 10 has relatively high reliability.

In summary, the embodiment of the present disclosure provides a display module. The display module includes a display panel and a support structure. The first flexible part of the support structure has good flexibility. When a display device is folded, the first flexible part of the support structure may provide buffer for the misalignment between the support structure and the display panel, thereby reducing the risk that the support structure pricks the display panel. Therefore, the yield of the display panel is relatively high, and the display device has a good display effect. In addition, because a rigid part disposed in a bending area in the support structure has good rigidity, the flatness of the display device after the display device returns to a flat state from a folded state can be ensured, and the display effect of the display device in the flat state can be ensured.

Figure 17:
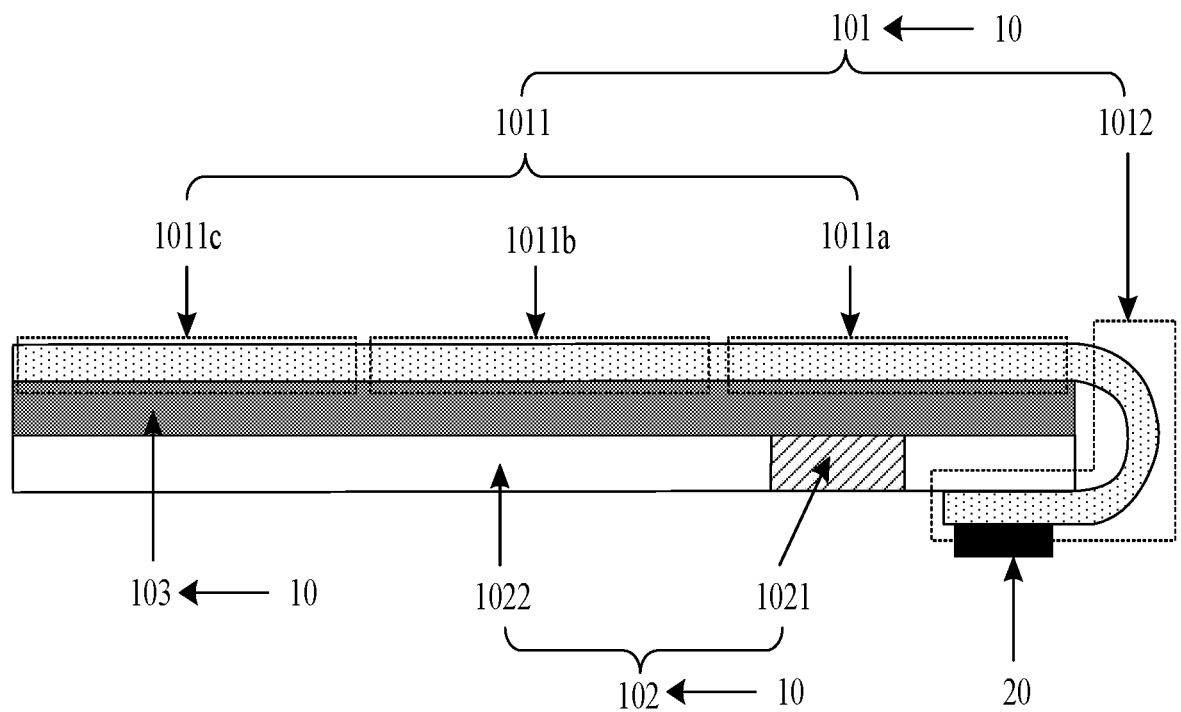
FIG. 17 is a schematic structural diagram of a display device according to an embodiment of the present disclosure.

FIG. 17 is a schematic structural diagram of a display device according to an embodiment of the present disclosure. As can be seen from FIG. 17, the display device may include a drive circuit 20 and the display module 10 provided in the foregoing embodiment. The drive circuit 20 may be disposed on the side, away from the support structure 102, of the bending portion 1012 of the display panel 101 in the display module 10. In addition, the drive circuit 20 may be configured to provide a drive signal to the display portion 1011 of the display panel 101.

The display device may be a foldable display device, and the foldable display device can be folded inward and can be folded outward.

Optionally, the display device may be any product or component with a display function, such as a piece of electronic paper, an OLED panel, a mobile phone, a tablet computer, a television, a display, a notebook computer, a digital photo frame, a navigator, and the like.

The foregoing are merely optional embodiments of the present disclosure, but are not intended to limit the present disclosure. Any modifications, equivalent replacements, improvements and the like made within the spirit and principles of the present disclosure shall be included in the scope of protection of the present disclosure.

What is claimed is:

1. A display module, comprising:
   a display panel, comprising a display portion and a bending portion connected to the display portion, wherein the display portion comprises a first non-bending area, a bending area, and a second non-bending area that are sequentially arranged in a direction away from the bending portion; and
   a support structure, disposed on a non-light-emitting side of the display portion, and comprising a first flexible part and a rigid part, wherein an orthographic projection of the first flexible part on the display panel is within the first non-bending area, and an orthographic projection of the rigid part on the display panel is overlapped with the first non-bending area, the second non-bending area, and the bending area;
   wherein one end of the bending portion is connected to the display portion, and an other end of the bending portion is bent to a side, away from the display portion, of the support structure.

2. The display module according to claim 1, wherein the orthographic projection of the first flexible part on the display panel is on a side, close to the bending area, of the first non-bending area.

3. The display module according to claim 1, wherein the support structure further comprises a second flexible part, wherein an orthographic projection of the second flexible part on the display panel is within the second non-bending area.

4. The display module according to claim 3, wherein the orthographic projection of the second flexible part on the display panel is on a side, close to the bending area, of the second non-bending area.

5. The display module according to claim 1, further comprising a first adhesive layer,
   wherein the first adhesive layer is between the display portion and the support structure.

6. The display module according to claim 5, wherein the first adhesive layer comprises a first adhesive and a second adhesive that are sequentially arranged in the direction away from the bending portion, wherein
   a first gap is provided between the first adhesive and the second adhesive, and an orthographic projection of the first gap on the display panel is overlapped with the orthographic projection of the first flexible part on the display panel.

7. The display module according to claim 6, wherein the support structure further comprises a second flexible part, wherein an orthographic projection of the second flexible part on the display panel is within the second non-bending area; and the first adhesive layer further comprises is a third adhesive on a side, away from the first adhesive, of the second adhesive; and
   a second gap is provided between the second adhesive and the third adhesive, and an orthographic projection of the second gap on the display panel is overlapped with the orthographic projection of the second flexible part on the display panel.

8. The display module according to claim 7, wherein the first gap is a strip-shaped gap, an extending direction of the first gap is parallel to a first boundary between the first non-bending area and the bending area, and a length of the first gap is equal to a length of the first boundary; and
   the second gap is a strip-shaped gap, an extending direction of the second gap is parallel to a second boundary between the second non-bending area and the bending area, and a length of the second gap is equal to a length of the second boundary,
   wherein the length of the first boundary is equal to the length of the second boundary.

9. The display module according to claim 1, wherein the first flexible part is a strip-shaped structure, an extending direction of the first flexible part is parallel to a first boundary between the first non-bending area and the bending area, and a length of the first flexible part is equal to a length of the first boundary.

10. The display module according to claim 1, wherein a material of the first flexible part comprises at least one of rubber and polyurethane foam.

11. The display module according to claim 1, wherein a material of the rigid part comprises a metal material.

12. The display module according to claim 1, wherein the display module further comprises a flexible cover plate on a light-emitting side of the display portion.

13. The display module according to claim 12, further comprising a polarizing layer,
   wherein the polarizing layer is disposed between the display portion and the flexible cover plate.

14. The display module according to claim 13, further comprising a second adhesive layer and a third adhesive layer; wherein
   the second adhesive layer is disposed between the polarizing layer and the flexible cover plate; and
   the third adhesive layer is disposed between the polarizing layer and the display portion.

15. The display module according to claim 1, further comprising a back film and a fourth adhesive layer; wherein
   the back film is disposed between the support structure and the display portion, and the fourth adhesive layer is disposed between the back film and the display portion.

16. A display device, comprising: a drive circuit and the display module according to claim 1,
   wherein the drive circuit is disposed on a side, away from a support structure, of a bending portion of a display panel, and the driving circuit is configured to provide a drive signal for a display portion of the display panel.

* * * * *